United States Patent
Lee et al.

(10) Patent No.: US 7,431,626 B2
(45) Date of Patent: Oct. 7, 2008

(54) HIGH EFFICIENCY ORGANIC ELECTROLUMINESCENT DISPLAY AND METHOD FOR FABRICATING THE SAME

(75) Inventors: Kwan-Hee Lee, Seoul (KR); Seoung-Yoon Ryu, Seoul (KR); Hun-Jung Lee, Anyang-si (KR); Sang-Il Park, Seoul (KR); Jae-Bon Koo, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 255 days.

(21) Appl. No.: 10/771,091

(22) Filed: Feb. 4, 2004

(65) Prior Publication Data
US 2004/0217697 A1    Nov. 4, 2004

(30) Foreign Application Priority Data
May 1, 2003    (KR) .................. 10-2003-0028076

(51) Int. Cl.
*H01L 51/10*    (2006.01)
*H01L 51/40*    (2006.01)
*H01J 9/18*    (2006.01)

(52) U.S. Cl. .................. 445/24; 313/504; 313/506; 428/690; 428/917; 427/66

(58) Field of Classification Search .......... 313/504–506
See application file for complete search history.

(56) References Cited

U.S. PATENT DOCUMENTS

| | | | | |
|---|---|---|---|---|
| 4,231,811 A | * | 11/1980 | Somekh et al. | 438/301 |
| 4,609,613 A | * | 9/1986 | Cogar et al. | 430/320 |
| 5,554,911 A | * | 9/1996 | Nakayama et al. | 313/504 |
| 6,541,130 B2 | * | 4/2003 | Fukuda | 428/690 |
| 6,639,250 B1 | * | 10/2003 | Shimoda et al. | 257/98 |
| 6,737,800 B1 | * | 5/2004 | Winters et al. | 313/504 |

(Continued)

FOREIGN PATENT DOCUMENTS

GB    2349979 A    * 11/2000

(Continued)

OTHER PUBLICATIONS

Korean Office Actionfor Korean Patent Application No. KR2003-28076, dated Jun. 21, 2005.

*Primary Examiner*—Sikha Roy
(74) *Attorney, Agent, or Firm*—Robert E. Bushnell, Esq.

(57) ABSTRACT

An organic electroluminescent display has: anode electrodes of R, G and B unit pixels formed separate from each other on a substrate; organic thin-film layers of the R, G and B unit pixels formed on the anode electrodes; and a cathode electrode formed over an entire surface of the substrate. The anode electrode of at least one unit pixel, among the R, G and B unit pixels, has a thickness different from anode electrodes of the other unit pixels. The anode electrode of each of the unit pixels comprises a first film having a high reflectivity and a second film for adjusting a work function. The second film of at least one unit pixel, among the unit pixels, has a thickness different from the second films of the other unit pixels. The second film of the R unit pixel is thicker than the second films of the other unit pixels.

5 Claims, 11 Drawing Sheets

U.S. PATENT DOCUMENTS

| | | | |
|---|---|---|---|
| 6,750,087 B2 * | 6/2004 | Morita et al. | 438/151 |
| 6,853,132 B2 * | 2/2005 | Maeda | 313/504 |
| 2002/0101556 A1 * | 8/2002 | Kikkawa et al. | 349/138 |
| 2003/0107326 A1 * | 6/2003 | Park et al. | 315/169.3 |
| 2003/0186478 A1 * | 10/2003 | Morita et al. | 438/30 |
| 2003/0193284 A1 * | 10/2003 | Park et al. | 313/504 |
| 2003/0234608 A1 * | 12/2003 | Lee et al. | 313/504 |
| 2005/0068267 A1 * | 3/2005 | Yoshioka et al. | 345/60 |

FOREIGN PATENT DOCUMENTS

| | | | |
|---|---|---|---|
| JP | 2846571 | | 10/1998 |
| JP | 10308285 A | * | 11/1998 |
| JP | 2000-323277 | | 11/2000 |
| KR | 2003-0058155 | | 7/2003 |

* cited by examiner

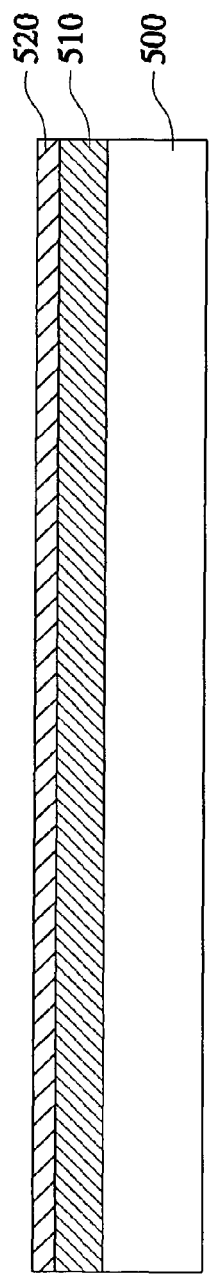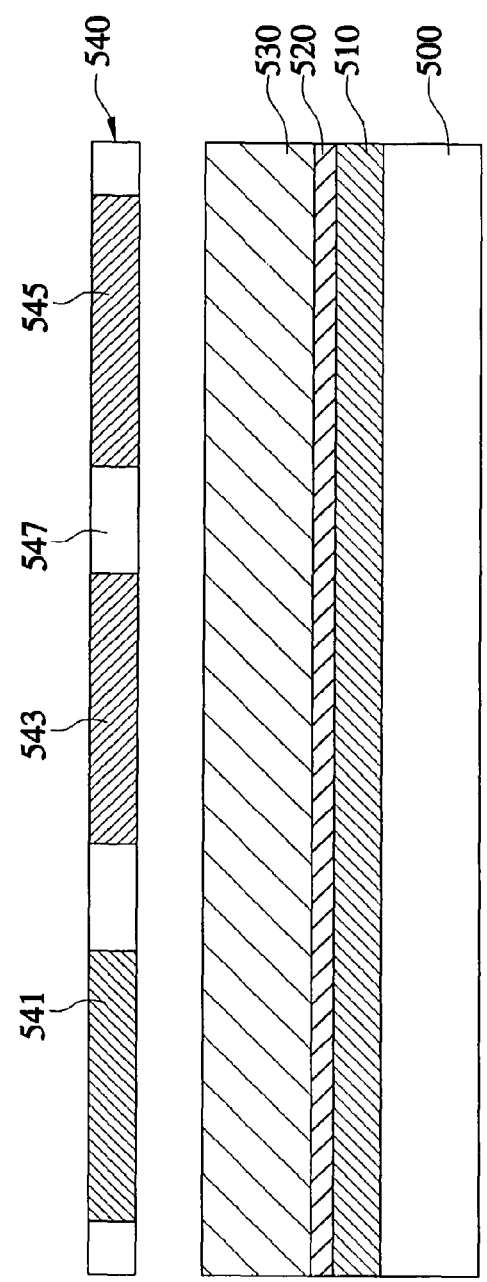
FIG. 4A
FIG. 4B

HIGH EFFICIENCY ORGANIC ELECTROLUMINESCENT DISPLAY AND METHOD FOR FABRICATING THE SAME

CLAIM OF PRIORITY

This application makes reference to, incorporates the same herein, and claims all benefits accruing under 35 U.S.C. §119 from my application HIGH EFFICIENCY OELD AND METHOD FOR FABRICATING THE SAME filed with the Korean Industrial Property Office on 1 May 2003 and there duly assigned Serial No. 10-2003-0028076.

BACKGROUND OF THE INVENTION

1. Technical Field

The present invention relates to a flat panel display and, more particularly, to an organic electroluminescent display and a method for fabricating the same, capable of improving luminous efficiency and color reproduction by differentiating thicknesses of anode electrodes of respective R, G and B unit pixels.

2. Prior Art

Generally, an organic electroluminescent display (OELD) is classified into a front surface emitting display and a rear surface emitting display depending upon the surface of luminescence of light. On the basis of a substrate, in case of the rear surface emitting OELD, a light from an electroluminescent layer is emitted and passes through the substrate, while in the case of the front surface emitting OELD, light from the electroluminescent layer is emitted without passing through the substrate.

The efficiency of the rear surface emitting structure is determined depending upon optical characteristics of a reflection film and a transmissive anode electrode, and electrical characteristics of an organic thin-film layer including an electroluminescent layer. A hole transporting layer is formed so as to be thicker than an electron transporting layer since maximum constructive interference in optical characteristics is generated at a thickness of ¼ wavelength of light emitted. The mobility of the hole transporting layer is faster than that of the electron transporting layer in terms of the electrical characteristics. Therefore, the thickness of the electroluminescent layer presenting the maximum efficiency is determined when a full color OELD of the rear surface emitting structure is manufactured.

On the other hand, the thicknesses of the hole transporting layer, the electroluminescent layer and the electron transporting layer located between a reflective anode electrode and a transflective cathode electrode for measuring the optical thickness, and the electrical thickness in the front surface emitting OELD, are determined differently from the rear surface emitting OELD.

There have been prior attempts to obtain the maximum efficiency and the highest color purity by controlling the thicknesses of a hole injecting and transporting layer, an electroluminescent layer and an electron transporting layer making up the organic thin-film layer interposed between the anode electrode and the cathode electrode. Japanese Patent Registration No. 2846571 has disclosed technology in the area of the rear surface emitting organic electroluminescent display capable of obtaining a high color purity and efficiency by setting an optical film thickness of the anode electrode, the cathode electrode and the organic thin-film layers between the anode and cathode electrodes to achieve a peak in the strength of light emitted from the electroluminescent layer. Further, Japanese Laid-open Patent Publication No. 2000-323277 has disclosed technology in the area of the rear surface emitting organic electroluminescent display capable of obtaining a high efficiency and color purity by differently forming the thickness of thin-film layers, except for the electroluminescent layer, among the organic thin-film layers interposed between the anode electrode and the cathode electrode, depending upon the R, G and B unit pixels.

However, the front surface emitting organic electroluminescent display has a problem in that, although the thickness of the thin-film layers is set to ¼ wavelength of a desired light, it is difficult to obtain a desired efficiency and color purity since the electroluminescent layer is located between reflection sections of the reflective anode electrode and the semitransmissive cathode electrode.

On the other hand, in the front surface emitting electroluminescent display, U.S. patent application assigned Ser. No. 10/385,453 entitled "Organic Electroluminescent Device Employing Multi-Layered Anode", by Kwanhee Le, filed in the United States Patent & Trademark Office on the $12^{th}$ day of Mar. 2003, has disclosed technology capable of improving luminescence characteristics by forming an anode electrode of a multi-layered structure.

Anode electrodes of the respective R, G and B unit pixels are formed on an insulating substrate. The anode electrodes include a first anode and a second anode. A pixel defining layer is formed to expose portions of the anode electrodes, thereby forming apertures of the respective R, G and B unit pixels. Organic thin film layers of the R, G, and B unit pixels, including R, G, B electroluminescent layers, are formed on the anode electrodes of the R, G and B unit pixels, respectively, in the apertures. A semitransmissive cathode electrode is formed on the entire surface of the substrate.

The front surface emitting organic electroluminescent display has formed thereon anode electrodes with a 2-layered structure, employing a first anode electrode as a metal film having a high reflectivity, and a second anode electrode as a metal film capable of conforming with a work function, thereby improving luminous efficiency by increasing reflectivity and a hole injecting characteristic.

However, in the front surface emitting organic electroluminescent display, all of the second anode electrodes of the respective R, G and B unit pixels have the same thickness. Therefore, it is impossible to obtain desired color reproduction and efficiency, since the first anode electrode with a good reflectivity and the semitransmissive cathode electrode have respective lengths of optical constructive interference which are different from each other.

SUMMARY OF THE INVENTION

Therefore, to solve the problem described hereinabove, an object of the present invention is to provide an organic electroluminescent display, and a method for fabricating the same, capable of obtaining maximum color reproduction and highest efficiency.

Another object of the present invention is to provide an organic electroluminescent display, and a method for fabricating the same, capable of obtaining a desired color reproduction and illuminous efficiency by differently forming the thicknesses of anode electrodes of respective R, G and B unit pixels.

Still another object of the present invention is to provide an organic electroluminescent display, and a method for fabricating the same, capable of improving color reproduction and luminous efficiency by using a simple process of differently forming the thicknesses of anode electrodes of respective R, G and B unit pixels without an additional mask process.

To accomplish the above-mentioned objects, the present invention provides an organic electroluminescent display, comprising: anode electrodes of R, G and B unit pixels formed so as to be separated from each other on a substrate; organic thin-film layers of the R, G and B unit pixels formed on the anode electrodes; and a cathode electrode formed on an entire surface of the substrate; wherein an anode electrode of at least one unit pixel of the R, G and B unit pixels has a thickness different from anode electrodes of the other unit pixels.

In an embodiment of the invention, each of the anode electrodes of the unit pixels comprises a first film having a high reflectivity and a second film for adjusting a work function, and the second film of at least one unit pixel has a thickness different from the second films of the other unit pixels. The second film of the R unit pixel is thicker than the second films of the other unit pixels.

In a preferred embodiment of the invention, the thickness of the second film of the R unit pixel is in a range from 250 to 450 Å or from 700 to 750 Å, and the thicknesses of the second films of the G and B unit pixels are in a range from 50 to 150 Å. The thickness of the second film of the R unit pixel is in a range from 250 to 450 Å or from 700 to 750 Å, the thickness of the second film of the G unit pixel is in a range from 200 to 300 Å, and the thickness of the second film of the B unit pixel is in a range from 50 to 150 Å.

In a further embodiment of the invention, in order to obtain maximum efficiency, in the R, G and B unit pixels, the thickness of the second film of the R unit pixel is 375 Å, the thickness of the second film of the G unit pixel is 250 Å, and the thickness of the second film of the B unit pixel is 125 Å. Moreover, in order to obtain maximum color reproduction, the thickness of the second film of the R unit pixel is 750 Å, the thickness of the second film of the G unit pixel is 250 Å, and the thickness of the second film of the B unit pixel is 125 Å.

The first film of each of the unit pixels is composed of Al, Ag or an alloy film thereof, and the second films are composed of ITO or IZO.

Further, the present invention provides an organic electroluminescent display comprising a number of pixels, each including at least an anode electrode, wherein the anode electrodes of adjacent pixels among the number of pixels have different thicknesses with respect to each other.

In an embodiment of the invention, the anode electrode of each of the pixels comprises a first film having a high reflectivity and a second film for adjusting a work function, the second films of the anode electrodes of adjacent pixels having a thickness different from each other.

In addition, the present invention provides a method for fabricating an organic electroluminescent display, comprising the steps of: forming first anodes of R, G and B unit pixels on a substrate; forming an anode electrode of the R unit pixel by forming a second anode of the R unit pixel on the first anode of the R unit pixel; forming anode electrodes of the G and B unit pixels by forming second anodes of the G and B unit pixels on the first anodes of the G and B unit pixels; forming organic thin-film layers on the anode electrodes of the R, G and B unit pixels, respectively; and forming a cathode electrode on an entire surface of the substrate; wherein a second anode of at least one unit pixel, among the R, G and B unit pixels, has a thickness different from the thicknesses of the second anodes of the other unit pixels.

Further, the present invention includes a method for fabricating an organic electroluminescent display, comprising the steps of: forming sequentially a first anode electrode material and a second anode electrode material of the R, G and B unit pixels on a substrate; forming anode electrodes of the R, G and B unit pixels, each including a first anode and a second anode, by etching the first and the second anode electrode materials; forming organic thin-film layers on the anode electrodes of the R, G and B unit pixels, respectively; and forming a cathode electrode on an entire surface of the substrate; wherein a second anode of at least one unit pixel, among the R, G and B unit pixels, has a thickness different from the thicknesses of second anodes of the other unit pixels.

Further, the present invention includes a method for fabricating an organic electroluminescent display, comprising the steps of: forming first anodes of R, G and B unit pixels on a substrate; forming a second anode electrode material on an entire surface of the substrate; etching the second anode electrode material to form second anodes on the first anodes of the R, G and B unit pixels, respectively, and to form anode electrodes of the R, G and B unit pixels; forming organic thin-film layers on the anode electrodes of the R, G and B unit pixels, respectively; and forming a cathode electrode on an entire surface of the substrate; wherein a second anode of at least one unit pixel, among the R, G and B unit pixels, has a thickness different from the thicknesses of second anodes of the other unit pixels.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4A thru 4D are cross-sectional views of processes for fabricating an organic electroluminescent display in accordance with a second embodiment of the present invention;

DETAILED DESCRIPTION OF THE PREFERRED EMBODIMENT

Hereinafter, a detailed description of preferred embodiments of the present invention will be apparent in connection with the accompanying drawings.

Figure 1:
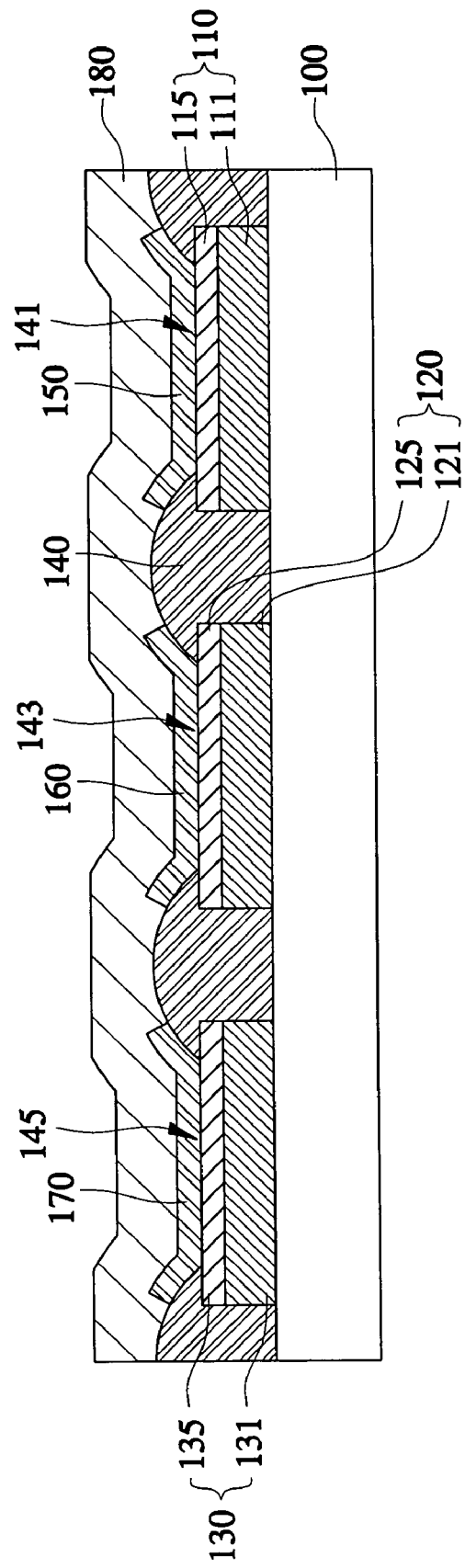
FIG. 1 is a cross-sectional view of a prior art organic electroluminescent display.

FIG. 1 is a cross-sectional view of a prior art organic electroluminescent display. As shown in FIG. 1, anode electrodes 110, 120 and 130 of the respective R, G and B unit pixels are formed on an insulating substrate 100. The anode electrodes 110, 120 and 130 include first anodes 111, 123, 125 and second anodes 121, 123 and 125, respectively. A pixel defining layer 140 is formed to expose portions of the anode electrodes 110, 120 and 130, thereby forming apertures 141, 143 and 145 of the respective R, G and B unit pixels.

Organic thin film layers 150, 160 and 170 of the R, G, and B unit pixels, including R, G, B electroluminescent layers, are formed on the anode electrodes 110, 120 and 130 of the R, G and B unit pixels in the apertures 141, 143 and 145, respectively. A semitransmissive cathode electrode 180 is formed on an entire surface of the substrate.

The front surface emitting organic electroluminescent display has anode electrodes with a 2-layered structure, employing a first anode electrode as a metal film having a high reflectivity, and a second anode electrode as a metal film capable of conforming with a work function, thereby improving luminous efficiency by increasing reflectivity and a hole injecting characteristic.

However, in the front surface emitting organic electroluminescent display, all of the second anode electrodes of respective R, G and B unit pixels have the same thickness. Therefore, it is impossible to obtain desired color reproduction and efficiency, since the first anode electrode with a good reflectivity and the semitransmissive cathode electrode have a different lengths of optical constructive interference with respect to each other FIG. 2 is a cross-sectional view of an organic electroluminescent display in accordance with an embodiment of the present invention.

Figure 2:
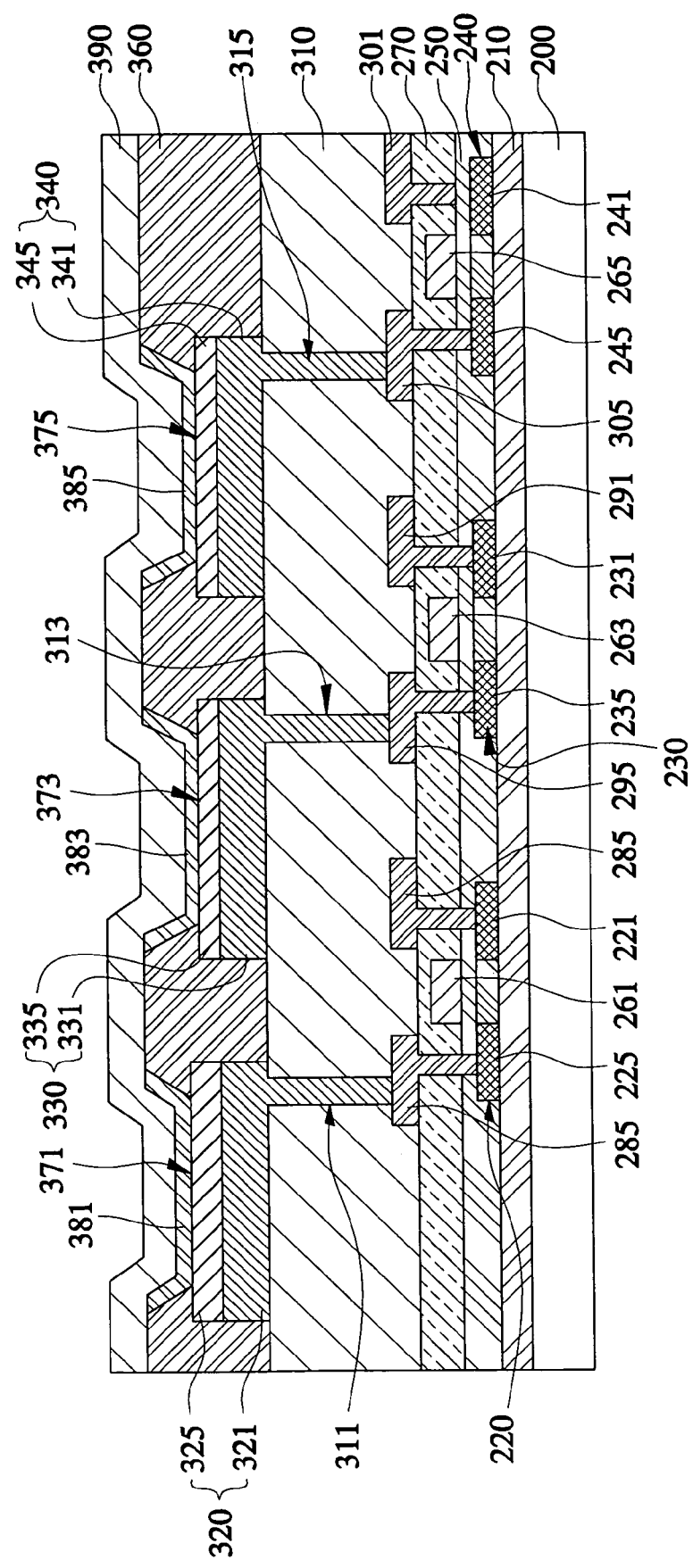
FIG. 2 is a cross-sectional view of an organic electroluminescent display in accordance with an embodiment of the present invention.

Referring to FIG. 2, a buffer layer 210 is formed on a transparent insulation substrate 200, and semiconductor layers 220, 230 and 240 of R, G and B unit pixels provided with source/drain regions 221 and 225, 231 and 235, and 241 and 245 are formed on the buffer layer 210, respectively. Gates 261, 263 and 265 of the respective unit pixels are formed on a gate insulating film 250, and source/drain electrodes 281 and 285, 291 and 295, and 301 and 305 of the respective unit pixels connected to the source/drain regions 221 and 225, 231 and 235, and 241 and 245 of the respective unit pixels through contact holes (not shown) are formed on an inter-layer insulating film 270.

Further, anode electrodes 320, 330 and 340 of the R, G and B unit pixels are formed on a planarization film 310 so as to be connected to one of the source/drain electrodes of thin-film transistors of the unit pixels, for example, drain electrodes 285, 295 and 305 through via-holes 311, 313 and 315, respectively. At this time, each of the anode electrodes 320, 330 and 340 of the R, G and B unit pixels includes a first anode 321, 331 and 341 having a high reflectivity and a second anode 325, 335 and 345 for adjusting a work function, and the second anode of at least one unit pixel among the R, G and B unit pixels, is formed to have a thickness different from the thicknesses of the second anodes of the other unit pixels.

In an embodiment of the present invention, the second anode 325 of the R unit pixel is formed so as to be thicker than the second anodes 335 and 345 of the G and B unit pixels, and the thicknesses of the second anodes 335 and 345 of the G and B unit pixels are formed with the same thickness. Otherwise, the second anode 325 of the R unit pixel is formed so as to be thicker than the second anodes 335 and 345 of the G and B unit pixels, and the second anode 335 of the G unit pixel is formed so as to be thicker than the second anode 345 of the B unit pixel.

On the planarization film 310, a pixel defining layer 360 for separating the anode electrodes 320, 330 and 340 of the respective unit pixels is formed. The pixel defining layer 360 is provided with apertures 371, 373 and 375 for exposing portions of the anode electrodes 320, 330 and 340, respectively. The pixel defining layer 360 may employ a conventional thermosetting resin or a photosensitive resin. Organic thin-film layers 381, 383 and 385 of the respective unit pixels are formed on the anode electrodes 320, 330 and 340 of the respective unit pixels in the apertures 371, 373 and 375, and a cathode electrode 390 is formed on an entire surface of the substrate. The organic thin-film layers 381, 383 and 385 of the respective unit pixels comprise an electroluminescent layer of the respective unit pixels, including at least one of a hole injecting layer, a hole transporting layer, a hole blocking layer, an electron injecting layer and an electron transporting layer.

The organic electroluminescent display in accordance with the present invention is capable of obtaining the highest luminous efficiency by forming the thicknesses of the second anodes 325, 335 and 345 of the anode electrodes 320, 330 and 340, respectively, of the R, G and B unit pixels, respectively, so as to be different from each other depending upon the unit pixels.

Hereinafter, a detailed description of a method for fabricating an organic electroluminescent display provided with anode electrodes having a thickness different from each other, depending upon the R, G and B unit pixels, in accordance with the present invention, will be provided. In the method for fabricating the organic electroluminescent display in accordance with the present invention, since the process prior to formation of the anode electrode is similar to a conventional method, hereinafter, only the process of forming the anode electrodes having thicknesses different from each other, depending upon the R, G and B unit pixels, and the following processes, will be described.

A description of the method for fabricating the organic electroluminescent display in accordance with a first embodiment of the present invention will be given with reference to FIGS. 3A to 3E.

Figure 3A:
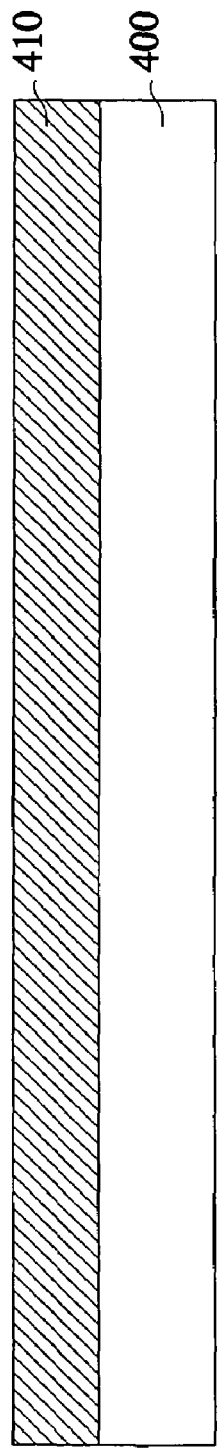
FIGS. 3A thru 3E are cross-sectional views of processes for fabricating an organic electroluminescent display in accordance with a first embodiment of the present invention.
Figure 3B:
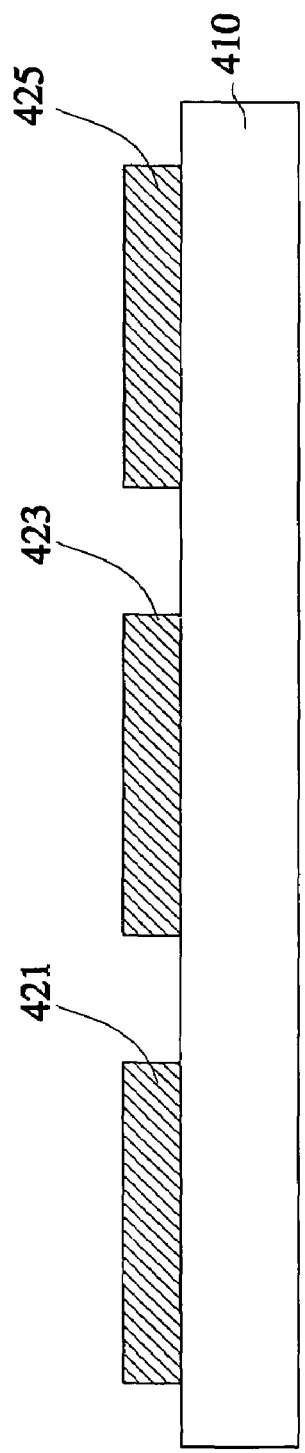

Referring to FIG. 3A, a first anode electrode material 410 is formed to have a thickness of 2000 Å, with a metal film such as Al, Ag or an alloy thereof having a high reflectivity, on a transparent insulating substrate 400, such as a glass substrate, by using a DC sputter. Referring to FIG. 3B, the first anode electrode material 410 is patterned to form first anodes 421, 423 and 425 with all of the R, G and B unit pixels having the same thickness.

Figure 3C:
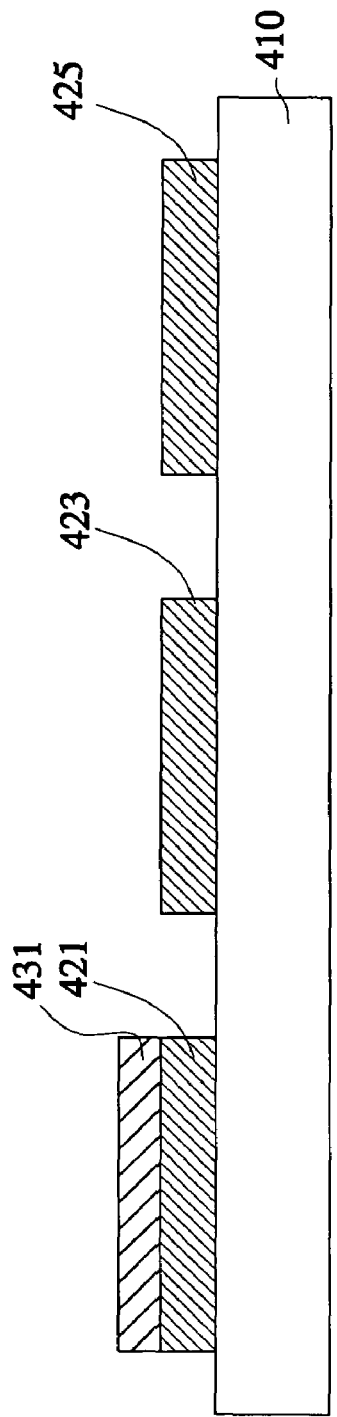

Referring to FIG. 3C, a second anode electrode material is deposited with a predetermined thickness on the entire surface of the substrate with a material having a suitable work function, for example, ITO or IZO, and is patterned to form a second anode 431 of the R unit pixel on the first anode 421 of the R unit pixel only. The second anode 431 of the R unit pixel is formed with a thickness of 250~450 Å or 700~750 Å, preferably 375 Å.

Figure 3D:
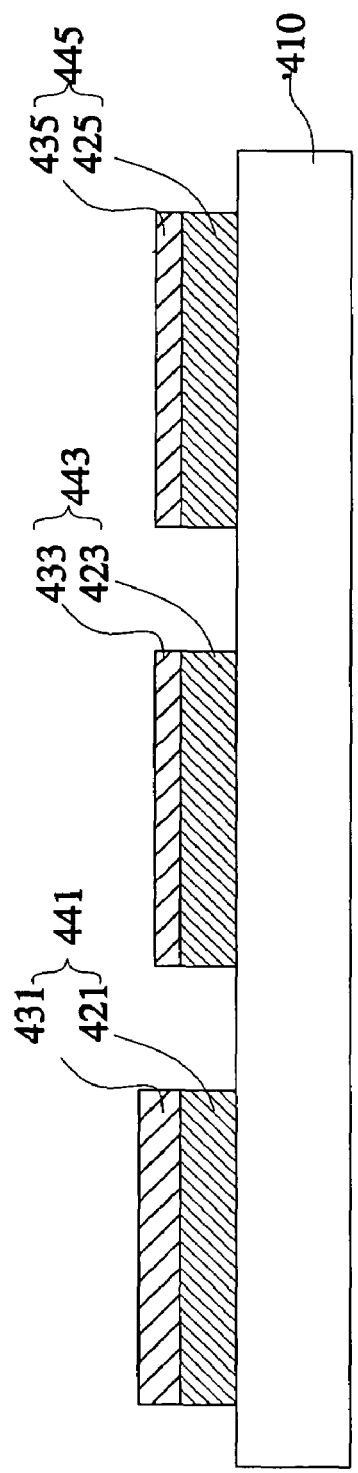

Referring to FIG. 3D, material the same as the second anode electrode material of the R unit pixel (for example, ITO or IZO) is deposited with a thickness of 50~150 Å on the entire surface of the substrate, and is patterned to form second anodes 433 and 435 of the G and B unit pixels on the first anodes 423 and 425, respectively. Therefore, the anode electrodes 441, 443 and 445 of the R, G and B unit pixels, including the first anodes 421, 423 and 435 having a high reflectivity and the second anodes having suitable work functions 431, 433 and 435, are formed.

On the other hand, by adding a mask process instead of equally forming the thicknesses of the second anodes of the G and B unit pixels, the second anode 433 of the G unit pixel is formed with a thickness of 200~300 Å, preferably 250 Å, and the second anode 435 of the B unit pixel is formed with a thickness of 50~150 Å, preferably 125 Å, thereby forming the second anodes 431, 433 and 435 of the R, G and B unit pixels, respectively, with different thicknesses from each other.

Figure 3E:
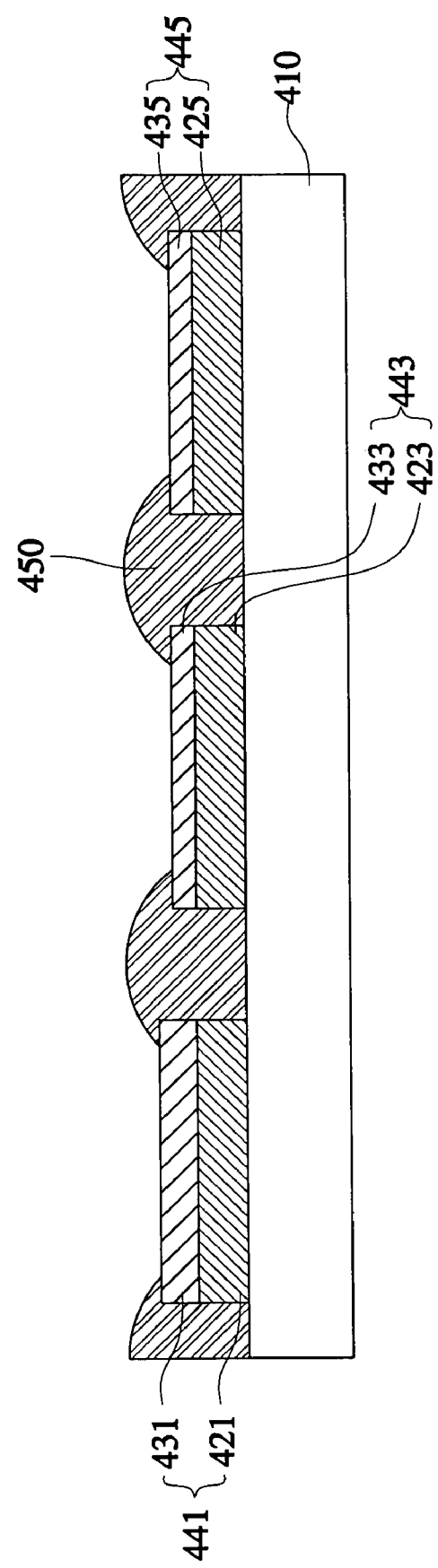

Referring to FIG. 3E, after the organic insulating film composed of a thermosetting resin or a photosensitive resin is deposited on the entire surface of the substrate, it is patterned by a conventional method to form a pixel defining layer 450 for separating the anode electrodes 441, 443 and 445 of the respective unit pixels. After the completion of forming the pixel defining layer 450, the layer 450 is sequentially cleansed by using water, isopropyl alcohol and acetone. Then, it is cleansed by using a UV/O3 cleanser. At this time, luminescence sections of the anode electrodes of the respective unit pixels are opened, depending upon the forming of the pixel defining layer 450, and have a pattern dimension of 2 mm×2 mm.

Subsequently, while not shown, in the process of forming the organic thin-film layer on the anode electrodes 441, 443 and 445, corresponding organic films from among the hole injecting layer, the hole transporting layer, the electroluminescent layer, the hole blocking layer, and the electron transporting layer of the R, G and B unit pixels are sequentially formed. The hole injecting layer is formed with a thickness of 250 Å by using an IDE 406 of Idemitsu Co. with vacuum deposition, and the hole transporting layer is formed with a thickness of 100 Å by vacuum deposition with a speed of 0.1 nm/sec by using NBP{N,N'-di(naphthalene-1-yl) -N,N'-diphenyl-benzidine}.

Continuously, CBP {4,4'-bis(carozol-9-yl)-biphenyl} and phosphorescene red are heat deposited with a 100: 12 mixing weight ratio to form the electroluminescent layer of the R unit pixel with a thickness of 300 Å. The CBP and IrPPy{tris (phenylpyridine)Iridium} are heat deposited with a 100:5 mixing weight ratio to form the electroluminescent layer of the G unit pixel with a thickness of 250 Å. A blue host and a blue dopant are heat deposited with a 100:4 mixing weight ratio to form the electroluminescent layer of the B unit pixel with a thickness of 150 Å.

Next, BAlq is deposited with a thickness of 50 Å to form a hole barrier layer, and Alq3 {tri(8-quinolinolate)-aluminium} is vacuum deposited to form the electron transporting layer with a thickness 250 Å. Magnesium (Mg) and silver (Ag) are heat deposited with 10:1 to 30:1 mixing weight ratio to form a semitransmissive cathode having a thickness of 50~150 Å, preferably 100 Å. Then, IZO is deposited using sputter, under a vacuum condition, of a speed of 0.2 nm/sec and a pressure of 1×10^-5 Pa to form a transmissive cathode electrode.

Finally, a passivation layer is formed to prevent oxygen and moisture from penetrating to the exterior, and to protect the inner organic thin-film layer. An encapsulation substrate is attached and encapsulated by using a UV adhesive under a nitrogen gas atmosphere and an anhydrous condition. Then, the front surface emitting organic electroluminescent display is manufactured by thermosetting fr 1 hour at a temperature of about 70° C.

A description of the method for fabricating the organic electroluminescent display in accordance with a second embodiment of the present invention will be provided with reference to FIGS. 4A to 4D. The fabricating method in accordance with the second embodiment of the present invention is accomplished with the same condition as the first embodiment, except that the mask process is reduced than the first embodiment by using a half-tone mask.

Referring to FIG. 4A, a first anode material 510 and a second anode material 520 are sequentially deposited on an insulating substrate 500. Referring to FIG. 4B, a photosensitive film 530 is coated on the second anode electrode material. Then, a photo process is performed by using the half-tone mask 540. The half-tone mask 540 includes: a light blocking section 541 for blocking light entirely, corresponding to a portion forming the anode electrode of the R unit pixel; half transmitting sections 543 and 545 for transmitting a portion of light, corresponding to portions forming the anode electrodes of the G and B unit pixels; and a transmitting section 547 for transmitting light entirely.

Figure 4C:
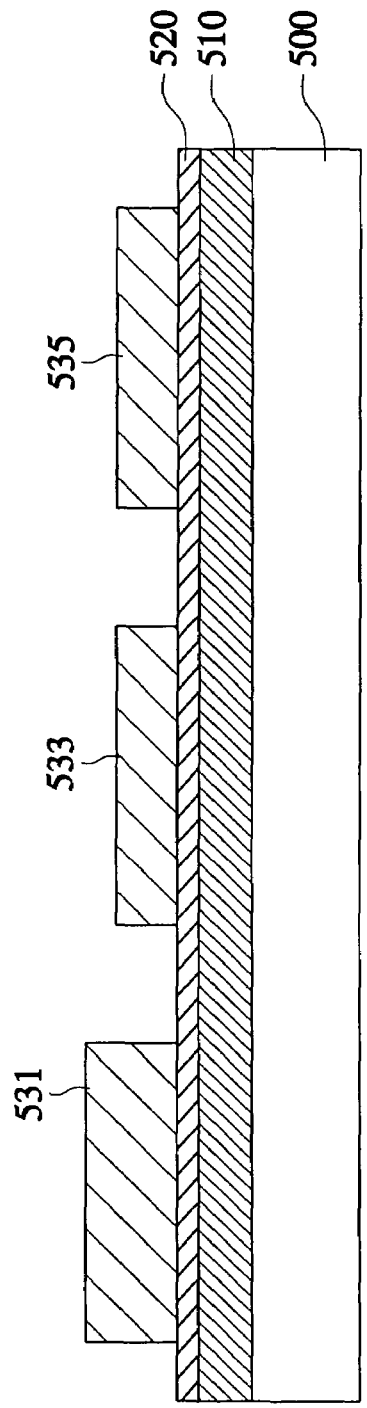

Referring to FIG. 4C, photosensitive film patterns 531, 533 and 535 having thicknesses different from each other, depending upon the R, G and B unit pixels, are formed by a photo process using the half-tone mask 540. The photosensitive film pattern 531 of the R unit pixel is formed so as to be thicker than the photosensitive film patterns 533 and 535 of the G and B unit pixels, and the photosensitive film patterns 533 and 535 of the G and B unit pixels have the same thickness.

Figure 4D:
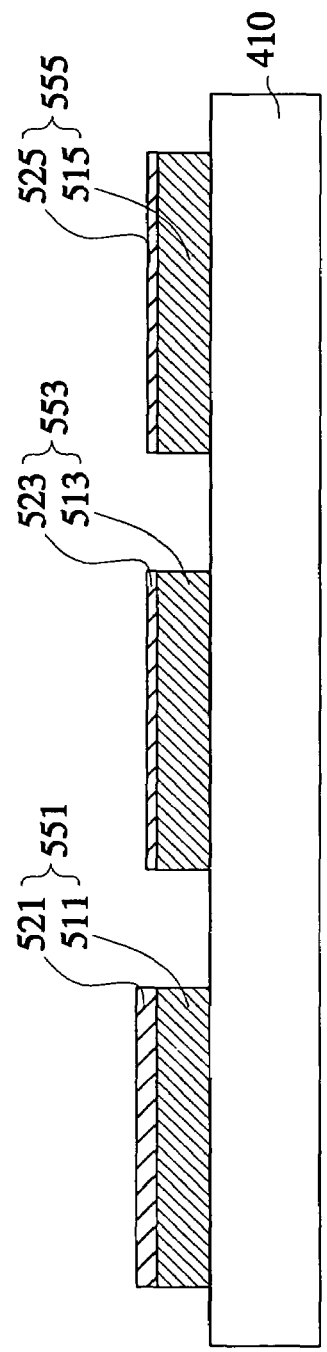

Referring to FIGS. 4C and 4D, the first and the second anode electrode materials 510 and 520 are patterned by using the photosensitive film patterns 531, 533 and 535 to form the anode electrodes 551, 553 and 555 having thicknesses different from each other, depending upon the R, G and B unit pixels. At this time, the first anodes 511, 513 and 515 from among the anode electrodes 551, 553 and 555 of the R, G and B unit pixels have the same thickness, and the second anodes 521, 523 and 525 have thicknesses different from each other, depending upon the thickness difference of the photosensitive film patterns 531, 533 and 535.

That is to say, the second anode 521 of the R unit pixel is formed so as to be thicker than the second anodes 523 and 525 of the G and B unit pixels, and the second anodes 523 and 525 of the G and B unit pixels are formed so as to have the same thickness. In the second embodiment, the second anodes 523 and 525 of the G and B unit pixels may be formed so as to have different thicknesses by making the thicknesses of the half transmitting patterns 543 and 545 of the half-tone mask 540 different when the photosensitive film 530 is patterned using the half-tone mask shown in FIG. 4B.

A description of the method for fabricating the organic electroluminescent display in accordance with a third embodiment of the present invention will be provided with reference to FIGS. 5A to 5D. The fabricating method in accordance with the third embodiment of the present invention is accomplished with the same condition as the first embodiment, except that the mask process is reduced relative to the first embodiment by using a half-tone mask.

Figure 5A:
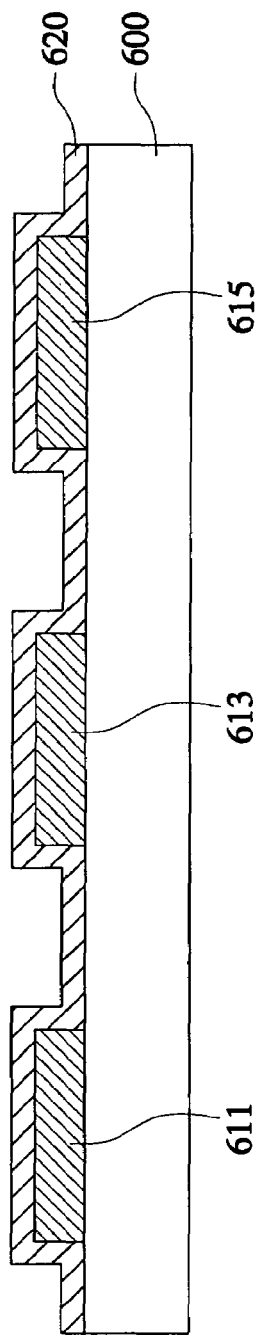
FIGS. 5A thru 5D are cross-sectional views of processes for fabricating an organic electroluminescent display in accordance with a third embodiment of the present invention.

Referring to FIG. 5A, a first anode electrode material is deposited and patterned on an insulating substrate 600 to form the first anodes 611, 613 and 615 of the R, G and B unit pixels having the same thickness. Subsequently, the second anode electrode material 620 is deposited on the substrate 600 including the first anodes 611, 613 and 615.

Figure 5B:
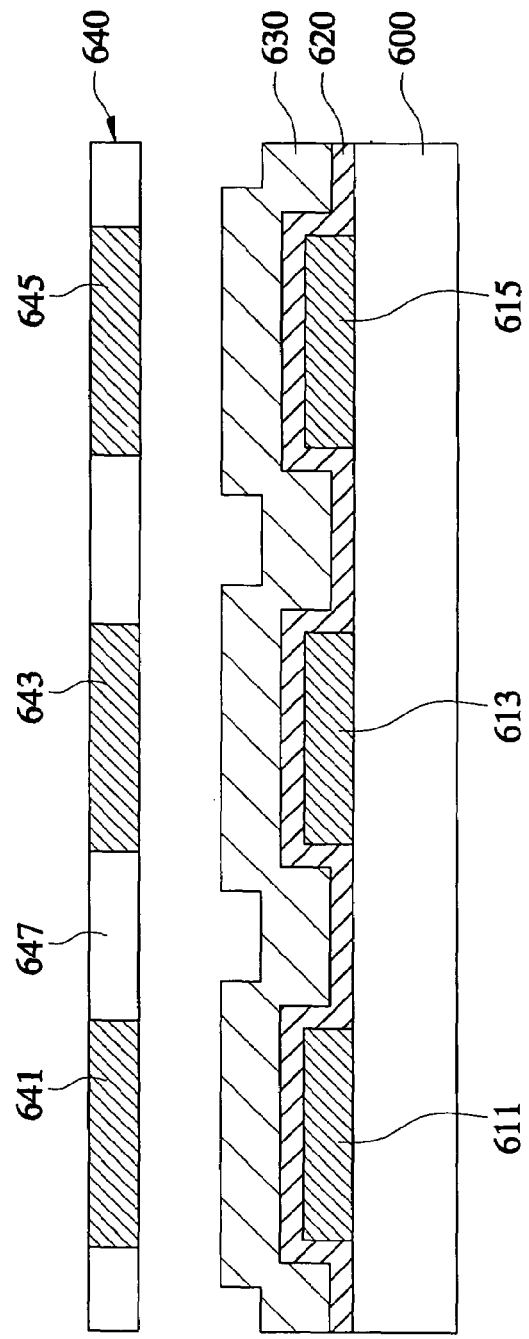

Referring to FIG. 5B, a photosensitive film 630 is coated on the second anode electrode material. Then, a photo process is performed by using the half-tone mask 640. The half-tone mask 640 includes: a light blocking section 641 for blocking light entirely, corresponding to a first anode 611 of the R unit pixel; half transmitting sections 643 and 645 for transmitting a portion of light, corresponding to second anodes 613 and 615 of the G and B unit pixels; and a transmitting section 647 for transmitting light entirely.

Figure 5C:
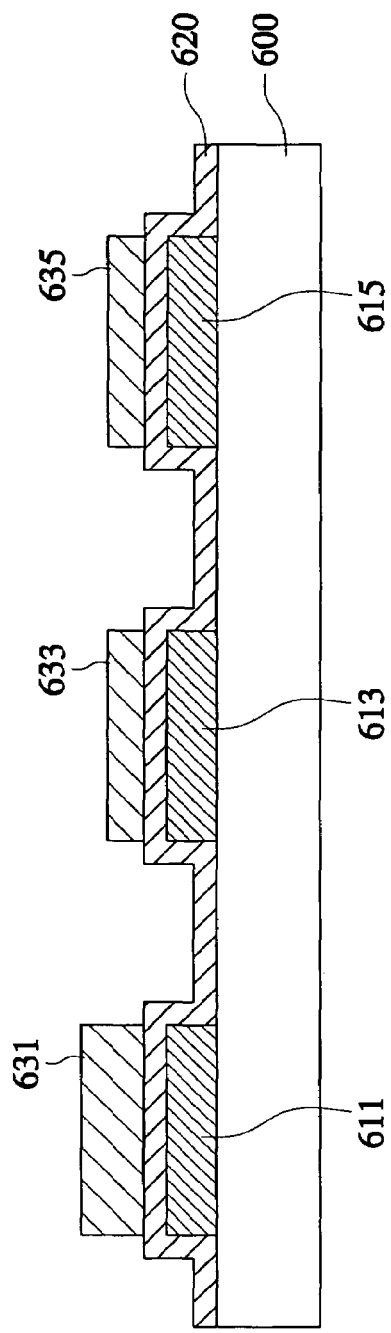

Referring to FIG. 5C, photosensitive film patterns 631, 633 and 635 having thicknesses different from each other, depending upon the R, G and B unit pixels, are formed by a photo process using the half-tone mask 640. The photosensitive film pattern 631 of the R unit pixel is formed so as to be thicker than the photosensitive film patterns 633 and 635 of the G and B unit pixels, and the photosensitive film patterns 633 and 635 of the G and B unit pixels have the same thickness.

Figure 5D:
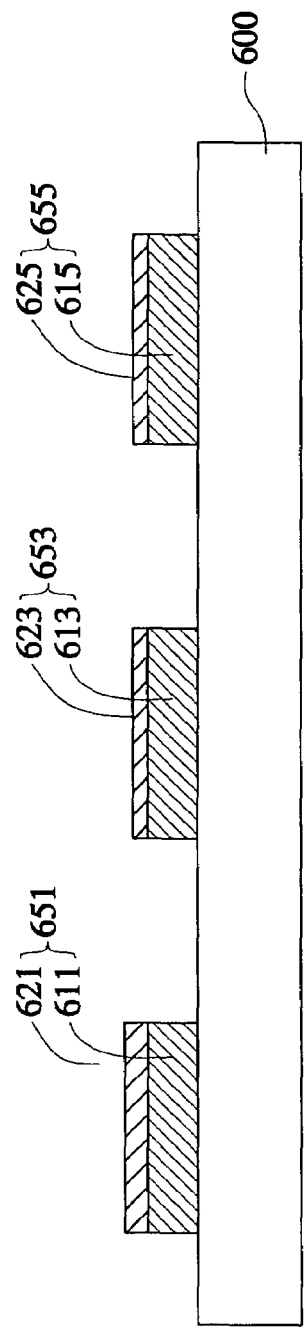

Referring to FIGS. 5C and 5D, the second anode electrode material 620 is patterned by using the photosensitive film patterns 631, 633 and 635 to form the second anodes 621, 623 and 625, respectively, having thicknesses different from each other depending upon the R, G and B unit pixels. That is to say, the second anode 621 of the R unit pixel is formed so as to be thicker than the second anodes 623 and 625 of the G and B unit pixels, and the second anodes 623 and 625 of the G and B unit pixels are formed so as to have the same thickness.

Therefore, the anode electrodes 651, 653 and 655 of the R, G and B unit pixels, respectively, are composed of the first anodes 611, 613 and 615, respectively, having the same thickness, and the second anodes 521, 523 and 525, respectively, having thicknesses different from each other, thereby having thicknesses different from each other depending upon the R, G and B unit pixels. In the third embodiment, the second anodes 623 and 625 of the G and B unit pixels, respectively, may be formed to have different thicknesses by making the thicknesses of the half transmitting patterns 643 and 645 different from each other when the photosensitive film 630 is patterned using the half-tone mask shown in FIG. 5B.

Table 1, Table 2 and Table 3 represent efficiency, brightness and chromaticity coordinates of the R, G and B unit pixels depending upon the thicknesses of the second anodes in accordance with the present invention.

TABLE 1

R unit pixel

| thickness (Å) | efficiency (Cd/A) | brightness (Lm/W) | chromaticity coordinates (CIE_x, CIE_y) |
|---|---|---|---|
| 125 | 5.92 | 3.60 | 0.62, 0.38 |
| 375 | 12.03 | 7.76 | 0.64, 0.35 |
| 500 | 0.44 | 0.19 | 0.68, 0.31 |
| 750 | 5.59 | 3.43 | 0.67, 0.33 |

TABLE 2

G unit pixel

| thickness (Å) | efficiency (Cd/A) | brightness (Lm/W) | chromaticity coordinates (CIE_x, CIE_y) |
|---|---|---|---|
| 125 | 32.33 | 17.26 | 0.23, 0.68 |
| 375 | 10.85 | 4.85 | 0.45, 0.53 |
| 500 | 0.23 | 0.06 | 0.32, 0.40 |
| 750 | 3.20 | 1.37 | 0.52, 0.47 |

TABLE 3

B unit pixel

| thickness (Å) | efficiency (Cd/A) | brightness (Lm/W) | chromaticity coordinates (CIE_x, CIE_y) |
|---|---|---|---|
| 125 | 4.24 | 2.81 | 0.13, 0.14 |
| 375 | 3.28 | 1.95 | 0.21, 0.49 |
| 500 | 0.17 | 0.07 | 0.18, 0.08 |
| 750 | 1.46 | 0.73 | 0.33, 0.53 |

From Table 1, the R unit pixel has the highest efficiency and brightness when the thickness is 375 Å, and the chromaticity coordinates has the highest value when the thickness is 750 Å. Therefore, considering all of the efficiency, brightness and chromaticity coordinates, it is preferable that the second anode of the anode electrode in the R unit pixel be formed with a thickness of 375 Å.

From Table 2, since the G unit pixel has the highest efficiency and brightness when the thickness is 125 Å, and the chromaticity coordinates are also stable, it is preferable that the second anode of the anode electrode in the G unit pixel be formed with a thickness of 125 Å.

From Table 3, since the B unit pixel has the highest efficiency and brightness when the thickness is 125 Å, and the chromaticity coordinates are also stable, it is preferable that the second anode of the anode electrode in the B unit pixel be formed with a thickness of 125 Å.

Figure 6A:
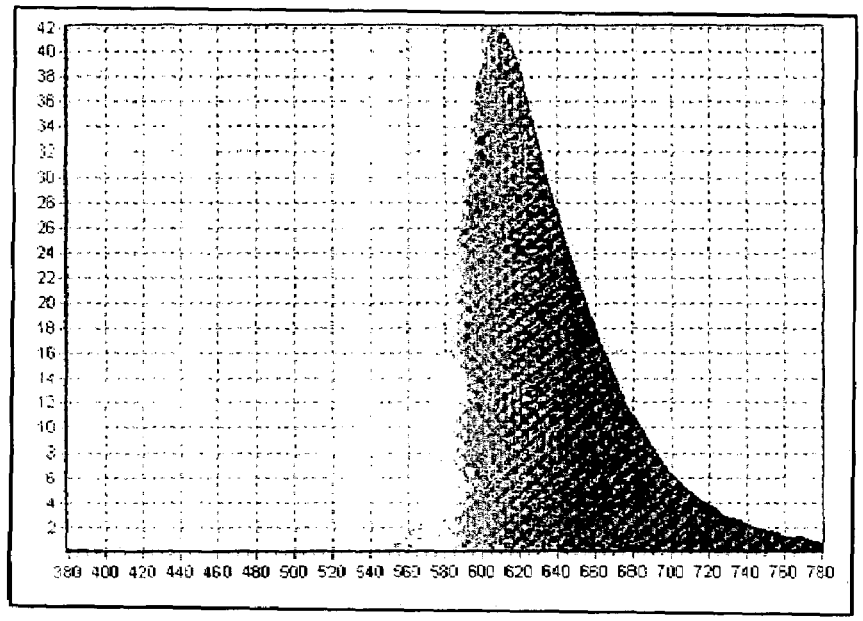
FIGS. 6A thru 6C are spectrums of R, G and B colors, respectively, in an organic electroluminescent display in accordance with the present invention.
Figure 6B:
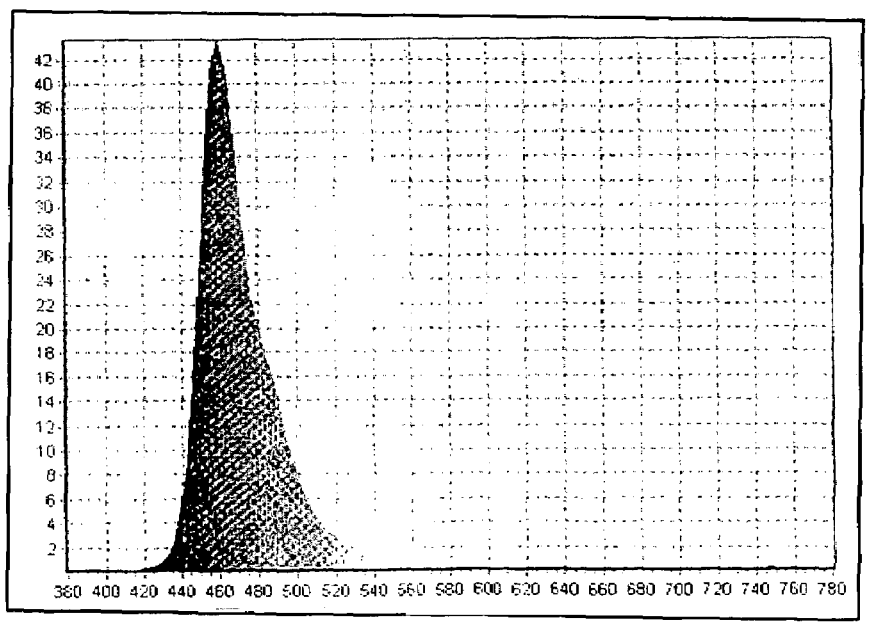
Figure 6C:
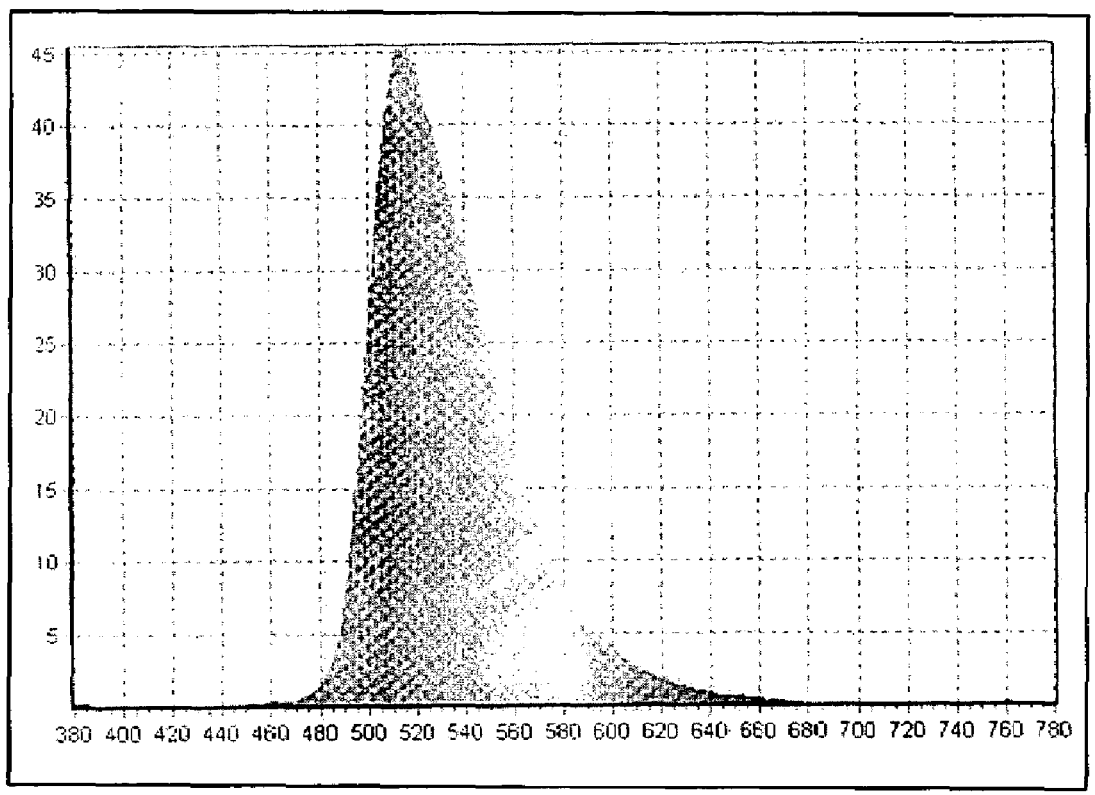

FIGS. 6A to 6C are spectrums of R, G and B, respectively, in an organic electroluminescent display in accordance with the present invention.

In accordance with the embodiment of the present invention, as the thicknesses of the electrodes for conforming the work function among the anode electrodes of the multi-layered structure are formed differently from each other depending upon the R, G and B unit pixels, the respective unit pixels are capable of obtaining the highest efficiency. Further, the R and B unit pixels are capable of obtaining both the highest efficiency and the maximum color purity when a full color device is embodied.

In addition, when the anode electrodes having different thicknesses are formed, since an additional process is excluded by adopting the half-tone mask, effects of a process simplification and yield improvement are produced.

While this invention has been described in connection with what is presently considered to be the most practical and preferred embodiment, it is to be understood that the invention is not limited to the disclosed embodiment, but on the contrary, it is intended to cover various modification within the spirit and the scope of the appended claims.

What is claimed is:

1. A method for fabricating an organic electroluminescent display, comprising the steps of:
    disposing first anodes of red, green and blue unit pixels on a substrate;
    forming an anode electrode of the red unit pixel by disposing a second anode of the red unit pixel on the first anode of the red unit pixel, each anode electrode of the red unit pixel including a first film having a high reflectivity and a second film for adjusting a work function;
    forming anode electrodes of the green and blue unit pixels by disposing second anodes of the green and blue unit pixels on the first anodes of the green and blue unit pixels, respectively, each anode electrode of the green and blue unit pixels including a first film having a high reflectivity and a second film for adjusting a work function;
    disposing respective organic thin-film layers on the anode electrodes of the red, green and blue unit pixels; and
    disposing a cathode electrode over an entire surface of the substrate;
    wherein the second anode of at least one unit pixel of the red, green and blue unit pixels has a thickness different from thicknesses of the second anodes of other unit pixels of the red, green and blue unit pixels; and
    wherein a thickness of the second film of the red unit pixel is in a range of one of 250 to 450 Å and 700 to 750 Å, a thickness of the second film of the green unit pixel is in a range of one of 50 to 150 Å and 200 to 300 Å, and a thickness of the second film of the blue unit pixel is in a range of 50 to 150 Å.

2. A method for fabricating an organic electroluminescent display, comprising the steps of:
- disposing sequentially a first anode electrode material and a second anode electrode material of red, green and blue unit pixels on a substrate;
- etching the first and second anode electrode materials to form anode electrodes of the red, green and blue unit pixels, each of the anode electrodes of the red, green and blue unit pixels including a first film having a high reflectivity and forming a first anode and a second film for adjusting a work function and forming a second anode;
- disposing respective organic thin-film layers on the anode electrodes of the red, green and blue unit pixels; and
- disposing a cathode electrode over an entire surface of the substrate;
- wherein the second anode of at least one unit pixel of the red, green and blue unit pixels has a thickness different from thicknesses of the second anodes of other unit pixels of the red, green and blue unit pixels;
- wherein the first and the second anode electrode materials are patterned by using photosensitive film patterns having thicknesses different from each other, depending upon the red, green and blue unit pixels; and
- wherein a thickness of the second anode of the red unit pixel is in a range of one of 250 to 450 Å and 700 to 750 Å, a thickness of the second anode of the green unit pixel is in a range of one of 50 to 150 Å and 200 to 300 Å, and a thickness of the second anode of the blue unit pixel is in a range of 50 to 150 Å.

3. The method according to claim 2, wherein the second anode of the red unit pixel is thicker than the second anodes of the other unit pixels.

4. The method according to claim 2, wherein the photosensitive film patterns are formed by a photo process using a half-tone mask.

5. A method for fabricating an organic electroluminescent display, comprising the steps of:
- disposing first anodes of red, green and blue unit pixels on a substrate;
- disposing a second anode electrode material over an entire surface of the substrate;
- etching the second anode electrode material to form respective second anodes on the first anodes of the R, G and B unit pixels, thereby forming respective anode electrodes of the red, green and blue unit pixels, each of the anode electrodes of the red, green and blue unit pixels including a first film having a high reflectivity and a second film for adjusting a work function;
- disposing organic thin-film layers on the respective anode electrodes of the red, green and blue unit pixels; and
- disposing a cathode electrode over an entire surface of the substrate;
- wherein a second anode of at least one unit pixel of the red, green and blue unit pixels has a thickness different from thicknesses of second anodes of other unit pixels of the red, green and blue unit pixels; and
- wherein a thickness of the second film of the red unit pixel is in a range of one of 250 to 450 Å and 700 to 750 Å, a thickness of the second film of the green unit pixel is in a range of one of 50 to 150 Å and 200 to 300 Å, and a thickness of the second film of the blue unit pixel is in a range of 50 to 150 Å.

* * * * *